(12) United States Patent
Kalberer

(10) Patent No.: US 8,315,285 B2
(45) Date of Patent: Nov. 20, 2012

(54) HEADER ASSEMBLY FOR EXTENDED TEMPERATURE OPTICAL TRANSMITTER

(75) Inventor: Martin Andre Kalberer, Redwood City, CA (US)

(73) Assignee: Finisar Corporation, Sunnyvale, CA (US)

(*) Notice: Subject to any disclaimer, the term of this patent is extended or adjusted under 35 U.S.C. 154(b) by 776 days.

(21) Appl. No.: 12/059,942

(22) Filed: Mar. 31, 2008

(65) Prior Publication Data
US 2009/0016391 A1 Jan. 15, 2009

Related U.S. Application Data

(60) Provisional application No. 60/909,336, filed on Mar. 30, 2007.

(51) Int. Cl.
*H01S 3/04* (2006.01)
(52) U.S. Cl. .......................... 372/36; 257/712
(58) Field of Classification Search ............... 372/36
See application file for complete search history.

(56) References Cited

U.S. PATENT DOCUMENTS

| | | | | |
|---|---|---|---|---|
| 5,872,803 | A * | 2/1999 | Mori et al. | 372/75 |
| 6,703,561 | B1 | 3/2004 | Rosenberg et al. | |
| 6,868,104 | B2 * | 3/2005 | Stewart et al. | 372/36 |
| 6,947,455 | B2 | 9/2005 | Chieng et al. | |
| 7,342,169 | B2 | 3/2008 | Venkatasubramanian | |
| 2003/0122081 | A1 * | 7/2003 | Herrera et al. | 250/341.6 |
| 2003/0156607 | A1 * | 8/2003 | Lipson et al. | 372/36 |
| 2003/0179794 | A1 * | 9/2003 | Mihashi et al. | 372/46 |
| 2005/0195865 | A1 * | 9/2005 | Aronson | 372/9 |
| 2006/0107989 | A1 * | 5/2006 | Bierschenk et al. | 136/212 |

OTHER PUBLICATIONS

Snyder et al, "Hot Spot Cooling using Embedded Thermoelectric Coolers," 22nd IEEE SEMI-THERM, Symposium, pp. 135-143 (2006).*
Website page: "Nextreme—Microscale Thermal and Power Management" "Thin-Film eTEC™ Technology", http://www.nextreme.com/pages/products/etec.html printed Apr. 16, 2008 (1 page).
Website page: "C&R Technologies—Hot Engineering, Cool Software—Thermoelectric Coolers", http://www.crtech.com/tec.html earliest available image of website Oct. 21, 2004 (1 page).
Website page: "Maxim—HFAN-08.2.0: Thermoelectric Cooler (TEC) Control", http://www.maxim-ic.com/appnotes.cfm/appnote_number/3318 Sep. 16, 2004 (5 pages).
Finisar Preliminary Product Specification, DWDM GBIC Transceiver, FTR-1631-XX, Aug. 2004, (10 pages).

* cited by examiner

*Primary Examiner* — Patrick Stafford
*Assistant Examiner* — Xinning Niu
(74) *Attorney, Agent, or Firm* — Maschoff Gilmore & Israelsen

(57) ABSTRACT

A header assembly for extended temperature optical transmitters is disclosed. The header assembly may include a hermetic enclosure and a header base with an interior surface. A plurality of conductive leads penetrate from the outer portion of the header assembly to the interior surface. A thermoelectric cooler ("TEC") having a planar configuration and a thickness not exceeding 500 microns is positioned adjacent to the interior surface of the header assembly, the TEC being in thermal communication with the header base and a mounting surface. A submount, on which a laser diode is positioned, is in thermal communication with the mounting surface of the TEC. In this manner, the TEC may be configured affect a selective transfer of heat to the laser diode and transfer of heat away from the laser diode. In some embodiments, the header assembly is configured to operate at optical data transmission rates of 10 Gbps or higher in such extended ambient temperatures.

20 Claims, 4 Drawing Sheets

HEADER ASSEMBLY FOR EXTENDED TEMPERATURE OPTICAL TRANSMITTER

CROSS-REFERENCE TO RELATED APPLICATIONS

This application claims priority to U.S. Provisional Patent Application Ser. No. 60/909,336 filed on Mar. 30, 2007, entitled HEADER ASSEMBLY OF EXTENDED TEMPERATURE OPTICAL TRANSMITTER, which is incorporated herein by reference in its entirety.

BACKGROUND OF THE INVENTION

1. Technology Field

The present invention generally relates to optical transmitters. In particular, the present invention relates to a header assembly configured to enable operation of an optical transmitter within increased temperature ranges by the use of improved thermoelectric cooler technology.

2. The Related Technology

Optical transmitters, such as a transmitter optical subassembly ("TOSA") for instance, are included in optical transceiver modules ("transceivers") to enable electrical data to be transmitted in the form of optical signals along an optical fiber that is operably connected to the transceiver. As their use expands into an ever-widening range of products, transceivers are being deployed into environments where various new challenges are encountered. One of these challenges deals with operation of the transceiver in environments having ambient temperatures above or below what is normally considered an acceptable temperature range. Specifically, the optical transmitter of a standard transceiver includes a laser diode that is optimized for operation within a relatively narrow ambient temperature range. Should the ambient temperature exceed the desired range, performance of the laser, and hence operation of the transceiver itself, can be compromised.

Notwithstanding the above challenge, an increasing need has developed for optical transmitters and transceivers that are configured for use in what are commonly referred to as "industrial temperatures," i.e., temperatures as low as −40 degrees Celsius and as high as 85 degrees Celsius. In addition, as data rates increase, the ability for a transceiver to maintain its laser diode within acceptable operating ranges becomes correspondingly more critical.

In the prior art, Thermoelectric Coolers ("TECs") have been employed in conjunction with header assemblies. TECs can be configured to selectively cool or heat the laser diode of an optical transmitter. However, prior art TECs have been too large to practically include in many small form and high speed optical transmitters.

Thus a need exists for small form high speed optical transmitter that permits its laser diode to acceptably operate within the ambient industrial temperature range while avoiding degradation of the optical signal produced by the laser diode due to temperature effects. Moreover, it would also be advantageous for such optical transmitters to be enabled for use with high data rate transceivers, which are relatively more sensitive to temperature changes than other transceivers.

BRIEF SUMMARY OF THE INVENTION

Embodiments of the invention relate to header assemblies of extended temperature optical transmitters. In one embodiment, a temperature controlled header assembly is configured for high speed data communications. The header assembly includes a hermetic enclosure and a header base having an interior surface. A plurality of conductive leads may penetrate from the outer portion of the header assembly to the interior surface. A thermoelectric cooler ("TEC") having a planar configuration and a thickness not exceeding 500 microns may be positioned adjacent to the interior surface of the header assembly. Further, the TEC is in thermal communication with the header base and a mounting surface. A submount, on which a laser diode is positioned, is in thermal communication with the mounting surface of the TEC. As a result, the TEC may be configured to affect a selective transfer of heat to the laser diode and transfer of heat away from the laser diode.

In a further embodiment of the invention, the temperature controlled header assembly is included in a TOSA. In another embodiment of the invention, the temperature controlled header assembly is included in an optical transceiver module along with a receiver optical subassembly ("ROSA").

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only example embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to the figures wherein like elements are provided with like reference designations. It is understood that the drawings are diagrammatic and schematic representations of example embodiments of the invention, and are not limiting of the present invention nor are they necessarily drawn to scale.

FIGS. 1-6 depict various features of embodiments of the present invention, which is generally directed to a header assembly, sometimes also known as a transistor outline ("TO") package, for use in an optical transmitter. Various types of TO packages exist, such as the TO-66 and TO-46 packages. The header assembly includes a thermoelectric cooler ("TEC") that serves as a means for selectively cooling and selectively heating a laser diode included therein. Advantageously, the TEC is optimized for use in small form factor header assemblies configured for high data rate applications of at least 10 gigabits per second. Further, the TEC-equipped header assembly is configured to operate in environments having industrial temperatures, i.e., between −40 and 85 degrees Celsius and beyond, a temperature range traditionally rendering laser diode-based devices inoperable. By selectively cooling or heating its laser diode, the header assembly is able to ensure a proper laser diode temperature range despite extreme ambient temperatures. Furthermore, according to the embodiment disclosed herein, the TEC is relatively small, enabling its use in small header assembly packages configured for high data rate operation.

Figure 1:
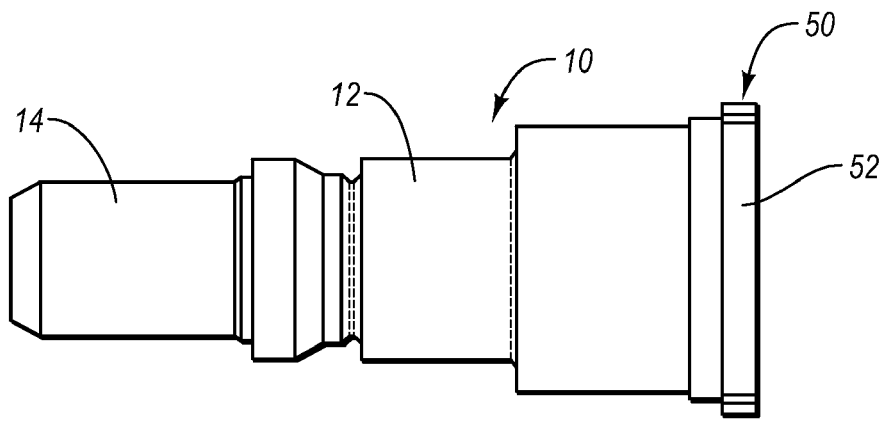
FIG. 1 is a side view of a TOSA including an embodiment of the present invention.

Reference is first made to FIG. 1, which shows an example of a TOSA, generally designated at 10. The TOSA 10 includes a body 12 for housing various internal components, some of which are described below. A nosepiece 14 is attached to the body 12 to enable interconnection of the TOSA 10 with a connectorized optical fiber (not shown). The body 12 and nosepiece 14 cooperate to define an interior optical path (not shown) to enable the passage of optical signals from a header assembly, generally designated at 50 and described in further detail below, to the optical fiber. The header assembly 50 includes a base 52, and FIG. 1 shows the general orientation of the header assembly with respect to the body 12 and nosepiece 14 of the of the TOSA 10.

Figure 2A:
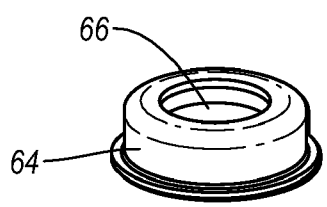
FIG. 2A is an exploded view of a header assembly included in the optical transmitter of FIG. 1, configured according to one embodiment.
Figure 2A:
Figure 2A:
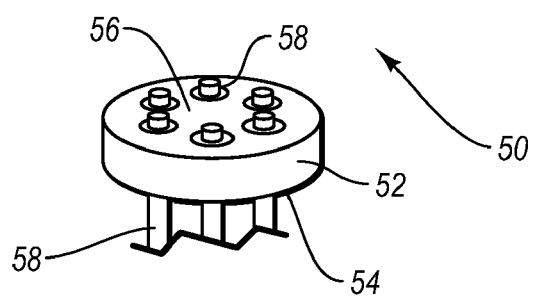
Figure 2B:
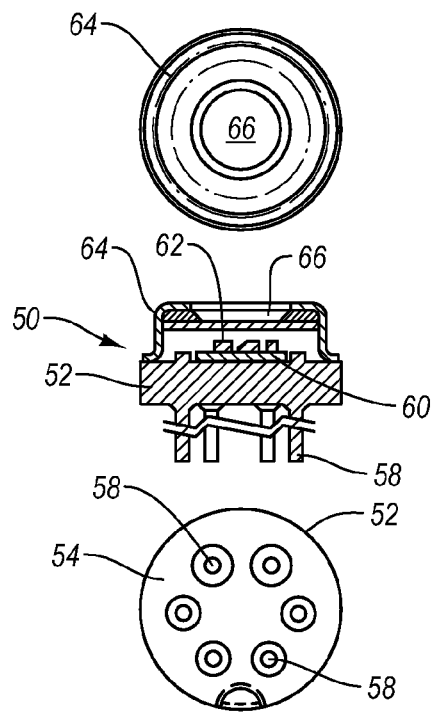
FIG. 2B shows various assembled views of the header assembly of FIG. 2A before placement of a thermoelectric cooler therein.

Together with FIG. 1, reference is now made to FIGS. 2A and 2B in describing further details regarding the header assembly 50. The base 52 of the header assembly 50 includes an exterior portion 54 and an interior portion 56. Multiple leads 58 penetrate the base 52 so as to extend between the exterior and interior portions 54 and 56. In the illustrated example, six leads 58 are included in the header assembly 50, but more or less than this can also be used.

A submount 60 is disposed proximate to the interior portion 56 of the header assembly base 52 and includes various components mounted thereon. One of these components is a laser diode 62 that is positioned on the submount 60 and configured to emit an optical signal for passage via the optical path defined by the TOSA 10 to the optical fiber (not shown). In the present embodiment, the laser diode 62 is a DFB laser, but other edge or surface emitting optical sources can alternatively be used. Examples of lasers include edge emitting lasers, such as double heterostructure, quantum well, strained layer, distributed feedback, and distributed Bragg reflector lasers. Further examples of lasers include vertical cavity surface-emitting laser (VCSELs) which have vertical laser cavities that emit light normal to the plane of the semiconductor device. The invention may also be used with other optoelectronic devices, such as optical receivers. Examples of optical receivers include pin diodes, such as photodiodes, avalanche photodetectors, and metal-semiconductor-metal detectors. Furthermore, other optical sources, such as LEDs and the like can also benefit from the principles of the present invention as described herein.

A cap 64 is configured to mate with an outer perimeter of the interior portion 56 of the base 52 so as to define a volume containing the submount 60 that is hermetically sealed from the exterior. A window 66 that is in alignment with the optical path is defined in the cap 64. Note that the cap 64 extends a minimal height above the submount 60 and contains the components located on the submount 60. This minimal height is desired so as to enable the header assembly 50 to be employed in small form factor optical transmitter packages.

Figure 3:
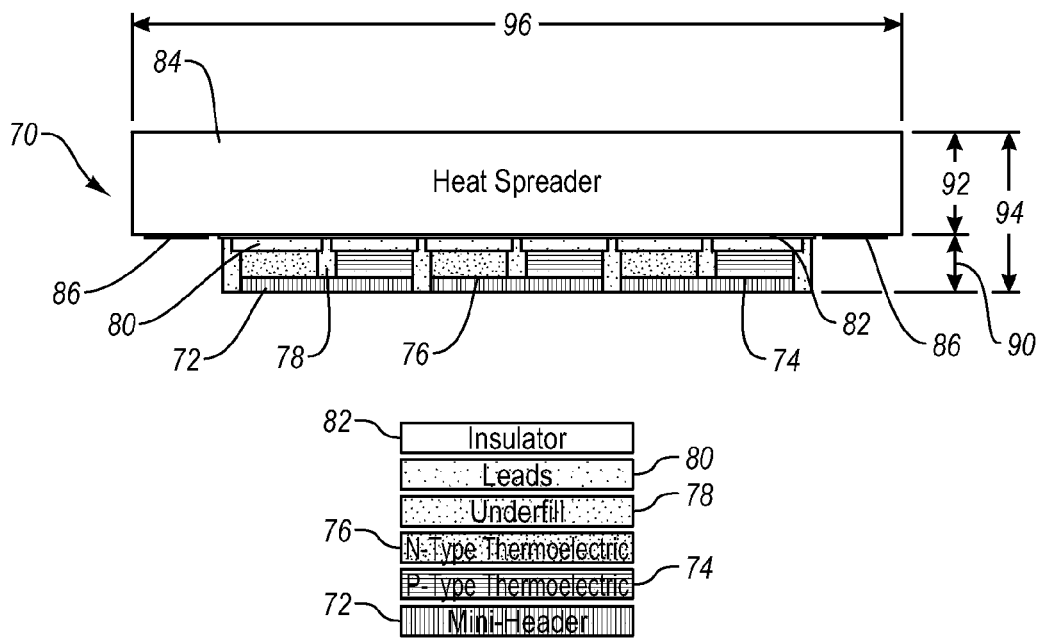
FIG. 3 shows views of various aspects of the thermoelectric cooler that is included in a header assembly of one embodiment of the present invention.

Reference is now made to FIG. 3, which depicts various features of a TEC generally designated at 70, which is employed in embodiments of the present invention. As shown, the TEC 70 includes a mini header 72 on which are disposed in an interchanging pattern both p-type thermoelectrics 74 and n-type thermoelectrics 76. The thermoelectrics 74 and 76 are interposed between an underfill material 78. Leads 80 are in electrical communication with the thermoelectrics 74 and 76 to enable their access to electrical power. An insulator 82 is positioned atop the leads 80, in the orientation shown in FIG. 3.

A heat spreader 84 is positioned atop the insulator 82 in the orientation shown in FIG. 3, and serves as a conduit for the transmission of thermal energy to or from selected components with which the TEC 70 is in thermal communication. Two TEC pads 86 are placed on selected extended portions of the heat spreader 84 to provide electrical connection to the leads 80.

Significantly, the TEC 70 shown in FIG. 3 has a thickness 94 of only approximately 500 microns or less, which is much thinner than other known TECs. Also shown are the heat spreader thickness 92 and the thickness 90 of the remaining components of the TEC 70. In one embodiment, the TEC thickness 94 is less than 300 microns, wherein the heat spreader thickness is less than 200 microns and the thickness 90 of the remaining components of the TEC 70 is approximately 100 microns. In yet another embodiment, wherein the heat spreader 84 is excluded from the TEC 70 as discussed below and shown in FIG. 6, the TEC thickness 94 becomes equivalent to the thickness 90 of the remaining components of the TEC 70. In at least one corresponding embodiment, the TEC thickness 94 is less than 200 microns.

Figure 4:
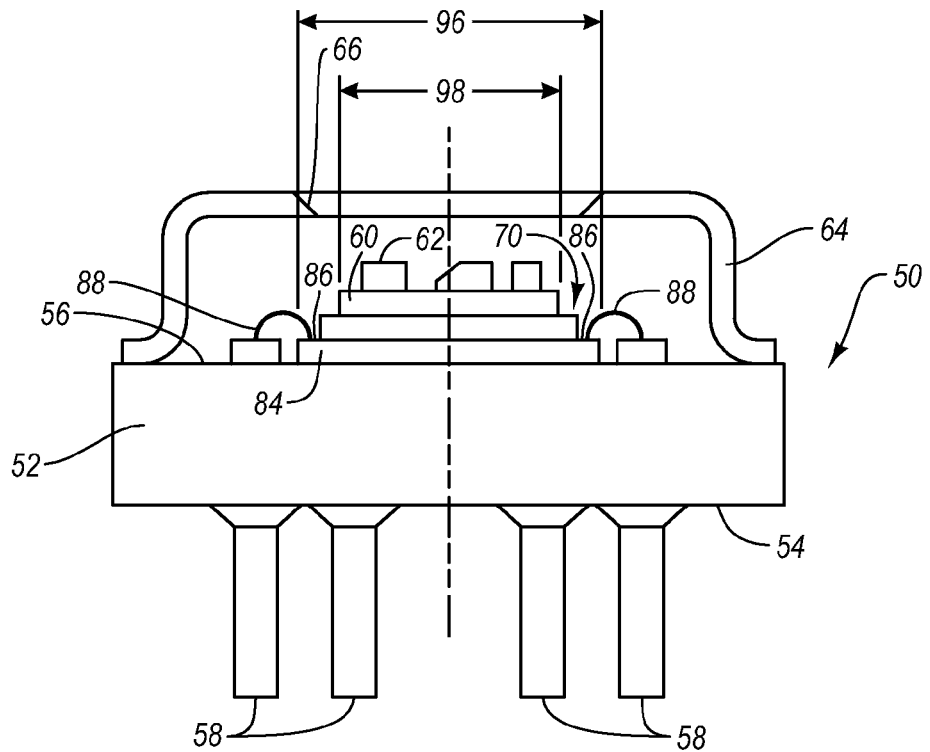
FIG. 4 is a cross sectional side view of a header assembly including the thermoelectric cooler according to one embodiment of the present invention.

The TEC width 96 is also shown. In one embodiment, the width 96 of the TEC 70 and the width 98 (as shown in FIG. 4) of the corresponding submount 60 are less than 8 millimeters. In another embodiment, the width 96 of the TEC 70 and the width 98 of the corresponding submount 60 are less than 6 millimeters. In yet another embodiment, the width 96 of the TEC 70 of the width 98 of the corresponding submount 60 are about 3 millimeters. The relatively small thicknesses and widths of the TEC 70 in turn enable the TEC's use in small form factor packages, such as in a TO66 package and the packages shown in FIGS. 2A and 2B.

Reference is now made to FIG. 4, which shows the header assembly 50 having the TEC 70 included therein. As shown, the TEC 70 is positioned within the header assembly 50 such that a heat spreader 84 is attached to the interior portion 56 of the header base 52. So positioned, the mini header 72 on the TEC 70 is oriented so as to support the submount 60, which is affixed to the top side of the TEC 70. The submount 60 is positioned on the mini header 72 so that light emissions from the laser diode 62 are aligned with an optical path through the TOSA 10.

The TEC 70 is provided electrical power for operation via wire bonds 88 that extend between the TEC pads 86 and the header leads 58. During operation, the TEC 70 operates to selectively heat or cool the laser diode 62. Specifically, as heat is produced by the laser diode 62 and other submount components, this heat is transferred to the submount 60. The TEC 70 is then engaged in cooling mode so as to remove the heat from the submount 60. This heat is transferred to the heat spreader 84 mounted against the interior portion 56 of the header base 52. The heat removed by the TEC 70 can then be dissipated into the header base 52 and TOSA 10.

An analogous process is followed for heating the laser diode 62 and other submount components. If the ambient temperature of the laser diode 62 falls below a certain level, the TEC 70 may be engaged in heating the laser diode 62 and other submount components in order to maintain the temperature of the laser diode 62 above a certain temperature or within a range of temperatures. To do so, the TEC 70 transfers heat to the submount 60 and transfers cold away from the submount 60 and to the heat spreader 84. Though the embodiment above describes the heat spreader mounted to the interior portion of the header base, an inverse positional relationship can be defined.

Figure 5:
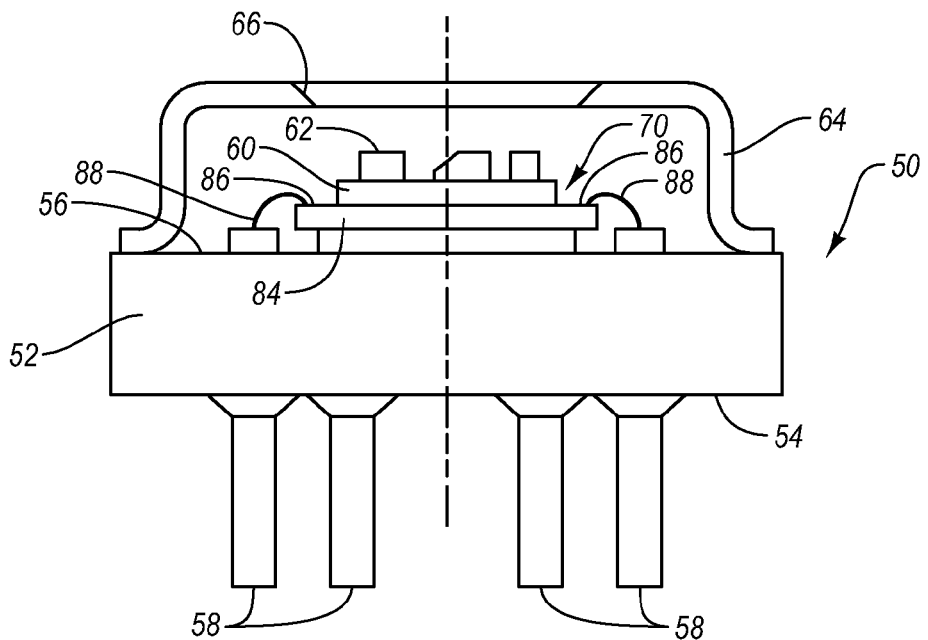
FIG. 5 is an additional cross sectional side view of a header assembly showing an alternative configuration of the thermoelectric cooler, according to one embodiment of the present invention.
Figure 6:
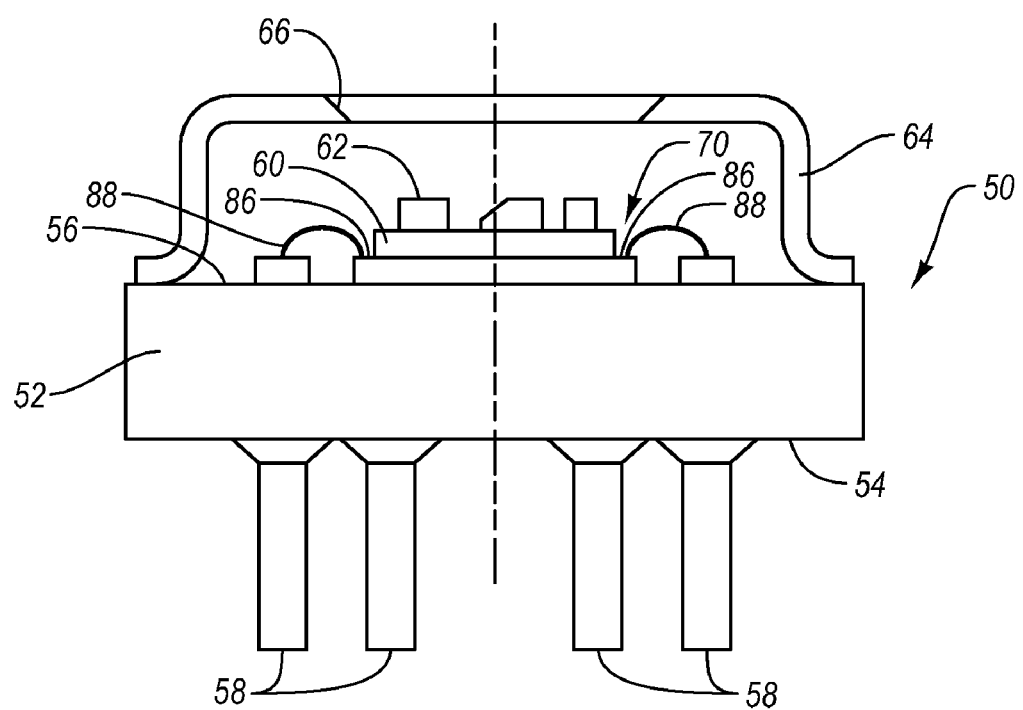
FIG. 6 is an additional cross sectional side view of a header assembly showing an additional alternative configuration of the thermoelectric cooler, according to one embodiment of the present invention.

Reference is now made to FIG. 5, which shows an embodiment of the header assembly 50, wherein the heat spreader 84 of the TEC 70 is positioned adjacent the submount 60 and the mini-header (not shown) of the TEC 70 is attached to the interior portion of the header base 52. In another possible embodiment, the TEC includes no heat spreader. Reference is now made to FIG. 6, wherein the insulator (not shown) of the TEC 70 mounts directly to the submount 60 to enable the TEC 70 to selectively heat and cool the laser diode 62. In this embodiment, the thickness of the TEC is reduced by the approximate thickness of the heat spreader.

Because of its small size, the TEC described above is optimized for temperature control in small size, high speed applications, such as the header assembly described herein. Typically, inclusion of a TEC into a header assembly requires lengthening of the wire bonds and/or header leads in order to facilitate electrical connection of the TEC, laser diode, and other components to the header leads. Because lengthening wire bonds or header leads often causes increased parasitic inductance as well as decreased performance, inclusion of TECs in high speed systems can be undesirable.

As a result of the TEC's relatively small thickness in the embodiments disclosed herein, the TEC disclosed herein enables the header assembly to acceptably perform at the high data rates increasingly employed in current communication networks. In particular, the relatively small thickness of the TEC lessens the need to increase the length of wire bonds extending from the TEC pads and submount components to the header leads. Similarly, the relatively small thickness of the TEC lessens or removes the need to increase the length of the header leads to accommodate inclusion of the TEC. Accordingly, the TEC as disclosed herein lessens or removes the need to modify existing header assemblies to facilitate inclusion of the TEC. By reducing the need to increase the length of the wire bonds or header leads, the present invention allows inclusion of a TEC into a header assembly without appreciably decreasing the performance of the header assembly.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

I claim:

1. A temperature-controlled header assembly for high speed data communication, comprising:
   a hermetic enclosure;
   a header base having an interior surface positioned within the hermetic enclosure;
   a plurality of conductive leads having top portions that penetrate into the hermetic enclosure from an outer portion of the header assembly to the interior surface;
   a thermoelectric cooler (TEC) positioned on the interior surface, the TEC having a substantially planar configuration and having a thickness not exceeding 500 microns, the TEC including a heat spreader, wherein the TEC is in thermal communication with the header base and a mounting surface of the TEC; and
   a submount on which a laser diode is positioned, the submount being in thermal communication with the mounting surface of the TEC such that the TEC is configured to affect selective transfer of heat to the laser diode and transfer of heat away from the laser diode,
   wherein none of the top portions of the conductive leads that penetrate into the hermetic enclosure extend past the TEC.

2. The temperature-controlled header assembly of claim 1, wherein the header assembly is configured to operate in ambient temperatures at least as low as minus 40 degrees Celsius and at least as high as 85 degrees Celsius.

3. The temperature-controlled header assembly of claim 1, wherein the TEC has a thickness of less than 300 microns.

4. The temperature-controlled header assembly of claim 3, wherein the heat spreader of the TEC has a thickness of less than 200 microns.

5. The temperature-controlled header assembly of claim 1, wherein the header assembly is configured for optical data communication speeds of at least 10 gigabits per second.

6. The temperature-controlled header assembly of claim 1, wherein the heat spreader of the TEC is disposed adjacent to an interchanging pattern of both p-type thermoelectrics and n-type thermoelectrics.

7. The temperature-controlled header assembly of claim 6, wherein the heat spreader includes a ceramic material.

8. The temperature-controlled header assembly of claim 6, wherein the spreader assembly includes glass.

9. The temperature-controlled header assembly of claim 6, wherein the TEC mounts directly to a surface of the submount and the heat spreader is adjacent to the header base.

10. The temperature-controlled header assembly of claim 6, wherein the TEC mounts directly to a surface of the submount and the heat spreader is disposed adjacent to the submount.

11. The temperature-controlled header assembly of claim 1, wherein the TEC is electrically connected to the conductive leads via wire bonds.

12. The temperature controlled header assembly of claim 1, wherein the laser diode is a DFB.

13. The temperature controlled header assembly of claim 1, wherein a width of the submount and the TEC collectively is less than 8 millimeters.

14. The temperature controlled header assembly of claim 1, wherein a width of the submount and the TEC collectively is less than 6 millimeters.

15. The temperature controlled header assembly of claim 1, wherein a width of the submount and the TEC collectively is about 3 millimeters.

16. A temperature-controlled transmitter optical subassembly (TOSA) for high speed data communication, comprising:
    a body for housing various internal components;

a nosepiece attached to the body to enable interconnection of the TOSA with a connectorized optical fiber, wherein the body and nosepiece cooperate to define an interior optical path; and a header assembly attached to the body and configured to emit an optical signal for passage via the optical path to the optical fiber, wherein the header assembly comprises:

a hermetic enclosure;

a base having an interior surface positioned inside the hermetic enclosure and an exterior surface positioned outside the hermetic enclosure;

a plurality of conductive leads having top portions that penetrate into the hermetic enclosure through the base from the exterior surface to the interior surface;

a thermoelectric cooler (TEC) positioned on the interior surface, the TEC having a substantially planar configuration and having a thickness not exceeding 500 microns, the TEC including a heat spreader in thermal communication with the header base and a mounting surface of the TEC; and a submount on which a laser diode is positioned, the submount being in thermal communication with the mounting surface of the TEC such that the TEC can affect cooling and heating of the laser diode, wherein none of the top portions of the conductive leads that penetrate into the hermetic enclosure extend past the TEC.

17. The temperature-controlled TOSA of claim 16, wherein the TOSA is configured to operate in ambient temperatures at least as low as minus 40 degrees Celsius and at least as high as 85 degrees Celsius.

18. The temperature-controlled TOSA of claim 16, wherein the header assembly is configured for optical data communication speeds of at least 10 gigabits per second.

19. A temperature controlled optical transceiver module for high speed data communication including:

the TOSA of claim 16; and a receiver optical subassembly ("ROSA").

20. The temperature-controlled TOSA of claim 16, wherein the thickness of the TEC is less than 300 microns and the thickness of the heat spreader of the TEC is less than 200 microns.

\* \* \* \* \*